(12) United States Patent
Lin

(10) Patent No.: US 11,468,964 B2
(45) Date of Patent: Oct. 11, 2022

(54) REPAIR CIRCUIT OF MEMORY AND METHOD THEREOF

(71) Applicant: NS POLES TECHNOLOGY CORP., Zhuhai (CN)

(72) Inventor: Chin-Hsi Lin, Zhuhai (CN)

(73) Assignee: NS POLES TECHNOLOGY CORP., Zhubai (CN)

( * ) Notice: Subject to any disclaimer, the term of this patent is extended or adjusted under 35 U.S.C. 154(b) by 99 days.

(21) Appl. No.: 16/890,315

(22) Filed: Jun. 2, 2020

(65) Prior Publication Data

US 2021/0224170 A1    Jul. 22, 2021

(30) Foreign Application Priority Data

Jan. 22, 2020    (TW) .................................. 109102347

(51) Int. Cl.
*G11C 29/00*    (2006.01)
*G06F 11/20*    (2006.01)
*G11C 29/44*    (2006.01)

(52) U.S. Cl.
CPC .......... *G11C 29/70* (2013.01); *G06F 11/2094* (2013.01); *G11C 29/44* (2013.01); *G11C 29/88* (2013.01); *G06F 2201/82* (2013.01)

(58) Field of Classification Search
None
See application file for complete search history.

(56) References Cited

U.S. PATENT DOCUMENTS

| 6,144,577 | A  | * | 11/2000 | Hidaka | G11C 29/808 365/212 |
| 6,504,784 | B1 | * | 1/2003 | Kokubo | G11C 11/413 365/189.09 |
| 2011/0267899 | A1 | * | 11/2011 | Kim | G11C 29/846 365/189.05 |
| 2012/0120733 | A1 | * | 5/2012 | Son | G11C 17/18 365/189.02 |
| 2013/0117636 | A1 | * | 5/2013 | Kim | G11C 29/04 714/773 |
| 2015/0003141 | A1 | * | 1/2015 | Son | G11C 29/785 365/96 |
| 2019/0237154 | A1 |  | 8/2019 | Choi | |

(Continued)

FOREIGN PATENT DOCUMENTS

| CN | 103310851 A | 9/2013 |
| JP | 2013196711 A | 9/2013 |
| JP | 201565500 A | 4/2015 |

(Continued)

OTHER PUBLICATIONS

Foreign Patent Search Document Issued By a Foreign Patent Office (10920607190/109102347).

*Primary Examiner* — Guerrier Merant
(74) *Attorney, Agent, or Firm* — Rosenberg, Klein & Lee

(57) ABSTRACT

A repair method of a memory includes dividing a plurality of general bits into a plurality of first groups and dividing a plurality of redundancy bits into a plurality of second groups. When one of the plurality of first groups has a defective bit, one of the plurality of second groups is selected to replace the first group which has the defective bit. Because the repair method uses a group as a repair unit, a repair circuit is simpler and smaller and a processing speed of the repair circuit is faster.

28 Claims, 8 Drawing Sheets

(56) References Cited

U.S. PATENT DOCUMENTS

2019/0287641 A1    9/2019  Ko
2019/0362805 A1   11/2019  Morzano et al.

FOREIGN PATENT DOCUMENTS

| TW | 201419297 A | 5/2014 |
| TW | 201442035 A | 11/2014 |
| TW | 201712690 A | 4/2017 |
| TW | 201901690 A | 1/2019 |

* cited by examiner

US 11,468,964 B2

REPAIR CIRCUIT OF MEMORY AND METHOD THEREOF

This application claims priority for Taiwan (R.O.C.) patent application no. 109102347 filed on 22 Jan. 2020, the content of which is incorporated by reference in its entirely.

BACKGROUND OF THE INVENTION

Field of the Invention

The present invention relates to a repair circuit of a memory and a method thereof, particularly to a repair circuit of a memory and a method thereof, which use a bit group as repair units.

Description of the Related Art

Owing to various non-ideal factors, a memory fabrication process may generate some defective bits. Therefore, a portion of a memory space may be configured to be redundancy bits in designing the memory. While a memory is found to have some defective bits in test, the redundancy bits may replace the defective bits, whereby to repair the memory and raise the yield of memory fabrication. In a conventional design, redundancy rows or redundancy columns are added to a memory to replace a row or a column, which contains a defective bit.

The conventional technology replaces bits of a whole row or column in repairing a memory. However, the good memory bits in the replaced row or column are wasted. As memory size is growing smaller and smaller and memory capacity is growing larger and larger, the density of a memory array is growing higher and higher. Thus, defective bits in a memory are also growing more and more. Then, a space requirement for accommodating redundancy rows or redundancy columns also increases. In order to configure sufficient memory bits of redundancy rows or columns for replacement, the memory need a vast added area. Therefore, the conventional technology of replacing a whole row or column is no more suitable for a small-size and high-capacity memory.

SUMMARY OF THE INVENTION

The objective of the present invention is to provide a repair circuit of a memory and a method thereof, which use a bit group as repair units.

According to one embodiment, the memory repair method of the present invention comprises steps: dividing a plurality of general bits into a plurality of first groups, and dividing a plurality of redundancy bits into a plurality of second groups; according to a repair data corresponding to one of the plurality of first group, determining whether to select one of the plurality of second groups to replace the corresponded first group, wherein the repair data include information of a second group to be selected, and wherein each of the first groups and the second groups has t bits, and wherein t is greater than or equal to 2.

According to one embodiment, the memory repair circuit of the present invention comprises a decoder and a selection circuit. The decoder generates a selection signal corresponding to a repair data corresponding to a first group. The selection circuit selects one of the second groups to replace the first group. The repair data include information of a second group to be selected. Each of the first groups and the second groups has t bits, and t is greater than or equal to 2.

The memory repair method of the present invention can reduce the area of the repair circuit and accelerate the processing speed of the repair circuit.

DETAILED DESCRIPTION OF THE INVENTION

Figure 1:
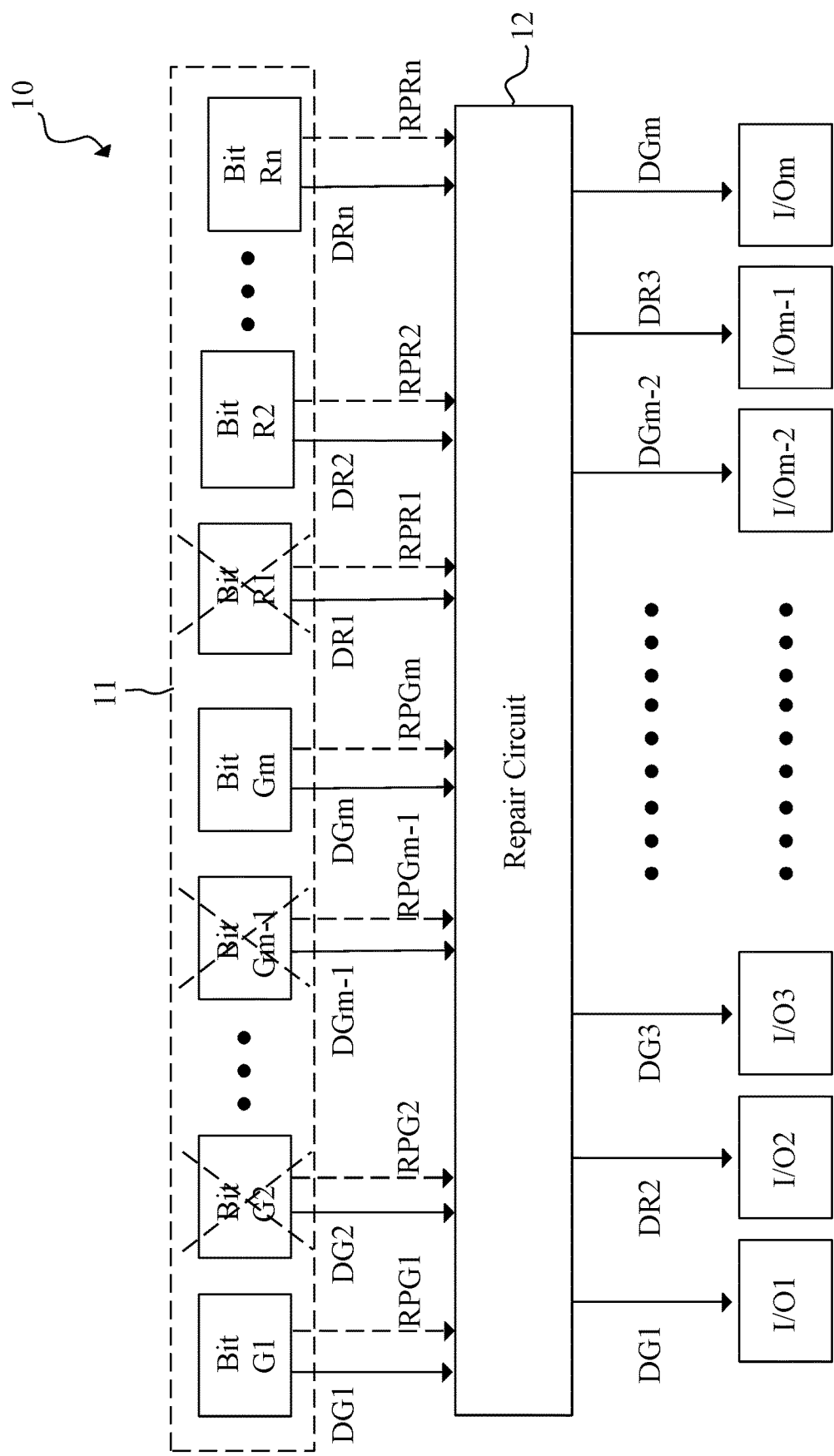
FIG. 1 shows a repair method using one bit as a repair unit.

FIG. 1 shows a bit-by-bit repair method using one bit as a repair unit, which can improve the problems of the conventional method. The memory 10 comprises a register 11, a repair circuit 12 and a plurality of input/output terminals I/O1-I/Om. The register 11 is connected with a plurality of memory bits G1-Gm and R1-Rn, which are selected from a memory array (not shown in the drawing). In FIG. 1, the memory bits G1-Gm and R1-Rn are disposed inside the register 11. However, it is only to express that these memory bits are connected to the register 11. In fact, the memory bits G1-Gm and R1-Rn are not disposed inside the register 11. The register 11 is configured to temporarily store the data DG1-DGm and DR1-DRn output by the memory bits G1-Gm and R1-Rn, or temporarily store the data to be written into the memory bits G1-Gm and R1-Rn. As the selected memory bits G1-Gm and R1-Rn are on the same row. Therefore, the register 11 is also called the row buffer. The memory bits G1-Gm are general bits, and the memory bits R1-Rn are redundancy bits. The data DG1-DGm are the data stored in the memory bits G1-Gm. The data DR1-DRn are the data stored in the memory bits R1-Rn. The memory bits G1-Gm and R1-Rn are simultaneously selected in an internal accessing activity. The internal accessing activity means that the memory 10 selects the desired memory bits from the memory array. For example, each internal accessing activity is to select all the memory bits on a row. After the memory bits G1-Gm and R1-Rn are selected in an internal accessing activity and connected to the register 11, the repair circuit 12 selects a plurality of memory bits corresponding to the input/output terminals I/O1-I/Om from the memory bits G1-Gm and R1-Rn. the memory 10 is detected to generates a plurality of repair data RPG1-RPGm and RPR1-RPRn, wherein the repair data RPG1-RPGm are respectively corresponding to the general bits G1-Gm, and the repair data RPR1-RPRn are respectively corresponding to the redundancy bits R1-Rn. The plurality of repair data RPG1-RPGm and RPR1-RPRn is configured to indicate whether the corresponding memory bits are defective bits. The repair data RPG1-RPGm and RPR1-RPRn may be but not limited to be provided by the register 11. In FIG. 1, the bits G2, Gm-1 and R1 are defective bits. While the repair circuit 12 matches the memory bits to the input/output terminals I/O1-I/Om, the repair circuit 12 determines that the 1st general bit G1 is a normal memory bit according to the repair data RPG1 and couples the bit G1 to the 1st input/output terminal I/O1. Thus, the data DG1 of the bit G1 can be accessed from the 1st input/output terminal I/O1. Next, the repair circuit 12 learns from the repair data RPG2 that the bit G2 is a defective bit. Thus, the repair circuit 12 abandons the bit G2 and selects one bit from the redundancy bits R1-Rn to take the place of the bit G2. At the same time, the repair circuit 12 learns from the repair data. RPR1 and RPR2 that the 1st redundancy bit R1 is a defective bit and the 2nd redundancy bit R2 is a good redundancy bit. Therefore, the repair circuit 12 selects the 2nd redundancy bit R2 to take the place of the bit G2 and couples the 2nd redundancy bit R2 to the 2nd input/output terminal I/O2. The repair circuit 12 repeats the abovementioned process and determines whether the bits G3-Gm are good memory bits according to the repair data RPG3-RPGm. If one bit is normal, the repair circuit 12 couples the bit to one of input/output terminals I/O3-I/Om. If one bit, such as the bit Gm-1, is a defective bit, the repair circuit 12 selects a normal and unused redundancy bit R3 from the redundancy bits and couples the redundancy bit R3 to the input/output terminal I/Om-1. A method for generating the repair data RPG1-RPGm and RPR1-RPRn can refer to US 20190220350.

In the embodiment shown in FIG. 1, the register 11 is configured to access the memory bits G1-Gm and R1-Rn. However, in another embodiment, the register 11 is omitted and the memory bits G1-Gm and R1-Rn selected by an internal accessing activity are directly coupled to the repair circuit 12.

Figure 2:
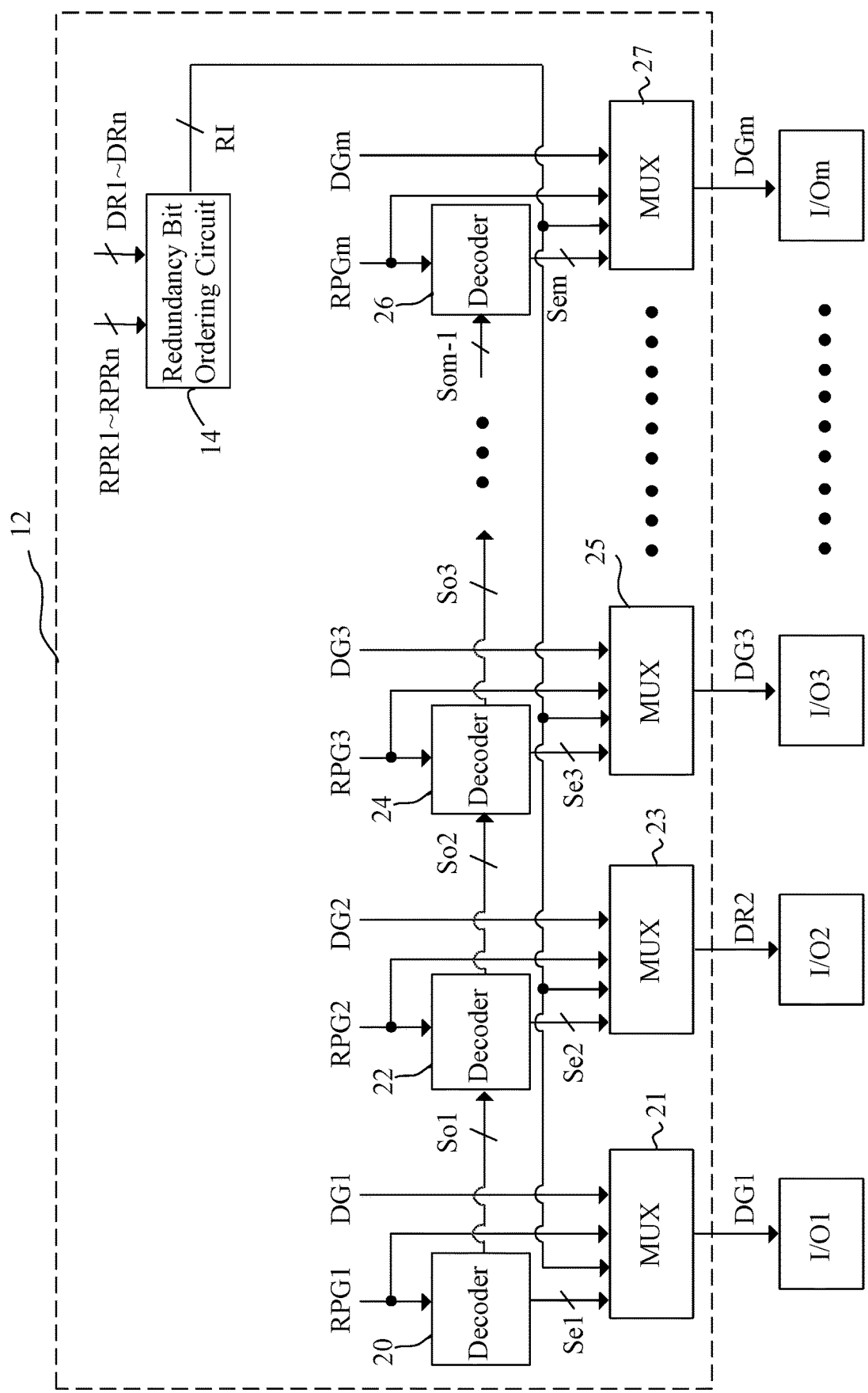
FIG. 2 shows an embodiment of the repair circuit in FIG. 1.

FIG. 2 shows an embodiment of the repair circuit 12 in FIG. 1. The repair circuit 12 includes a plurality of decoders 20, 22, 24 and 26; a plurality of selection circuits 21, 23, 25 and 27; and a redundancy bit ordering circuit 14. The 1st decoder 20 generates a selection signal Se1 and an accumulation signal So1 according to the repair data RPG1. The 2nd decoder 22 generates a selection signal Se2 and an accumulation signal So2 according to the repair data. RPG2 and the accumulation signal So1. The 3rd decoder 24 generates a selection signal Se3 and an accumulation signal So3 according to the repair data RPG3 and the accumulation signal So2. In the same way, the plurality of decoders 20, 22, 24 and 26 respectively receives repair data RPG1-RPGm and respectively outputs selection signals Se1-Sem. Except the 1st decoder 20, the other decoders 22, 24 and 26 respectively generate selection signals Se2-Sem according to the received repair data and the accumulation signals So1-Som-1 output by the preceding decoders. The plurality of accumulation signals So1-Som-1 records the next available redundancy bits or the numbers of the used redundancy bits. According to the plurality of repair data RPR1-RPRn, the redundancy bit ordering circuit 14 connects the good redundancy bits among the redundancy bits R1-Rn (DR1-DRn) to all the selection circuits 21, 23, 25 and 27. In the embodiment shown in FIG. 1, the bit R1 is defective, so the redundancy bit ordering circuit 14 would exclude the bit R1. Thus, the outputs R1 of the redundancy bit ordering circuit 14 are DR2-DRn (R2-Rn). The output terminals of the plurality of selection circuits 21, 23, 25 and 27 are respectively connected to the input/output terminals I/O1-I/Om. The selection circuits 21, 23, 25 and 27 may be implemented with multiplexers (MUX). According to the repair data RPG1 and the selection signal Se1, the 1st selection circuit 21 determines to couple the general bit G1 (DG1) or one of the redundancy bits R2-Rn (DR2-DRn) to the 1st input/output terminal I/O1. In the embodiment shown in FIG. 1, the general bit G1 is a good memory bit. Therefore, the selection circuit 21 couples the general bit G1 (DG1) to the input/output terminal I/O1. According to the repair data RPG2 and the selection signal Se2, the 2nd selection circuit 23 determines to couple the general bit G2 or one of the redundancy bits R2-Rn to the 2nd input/output terminal I/O2. In the embodiment shown in FIG. 1, the general bit G2 is a defective bit. Therefore, the selection circuit 23 selects the redundancy bit R2 (DR2) from the redundancy bits R2-Rn and couples the redundancy bit R2 to the input/output terminal I/O2. In the similar way, each of selection circuits 21, 23, 25 and 27 will finally couple one memory bit to the corresponding input/output terminals I/O1-I/Om.

Figure 3:
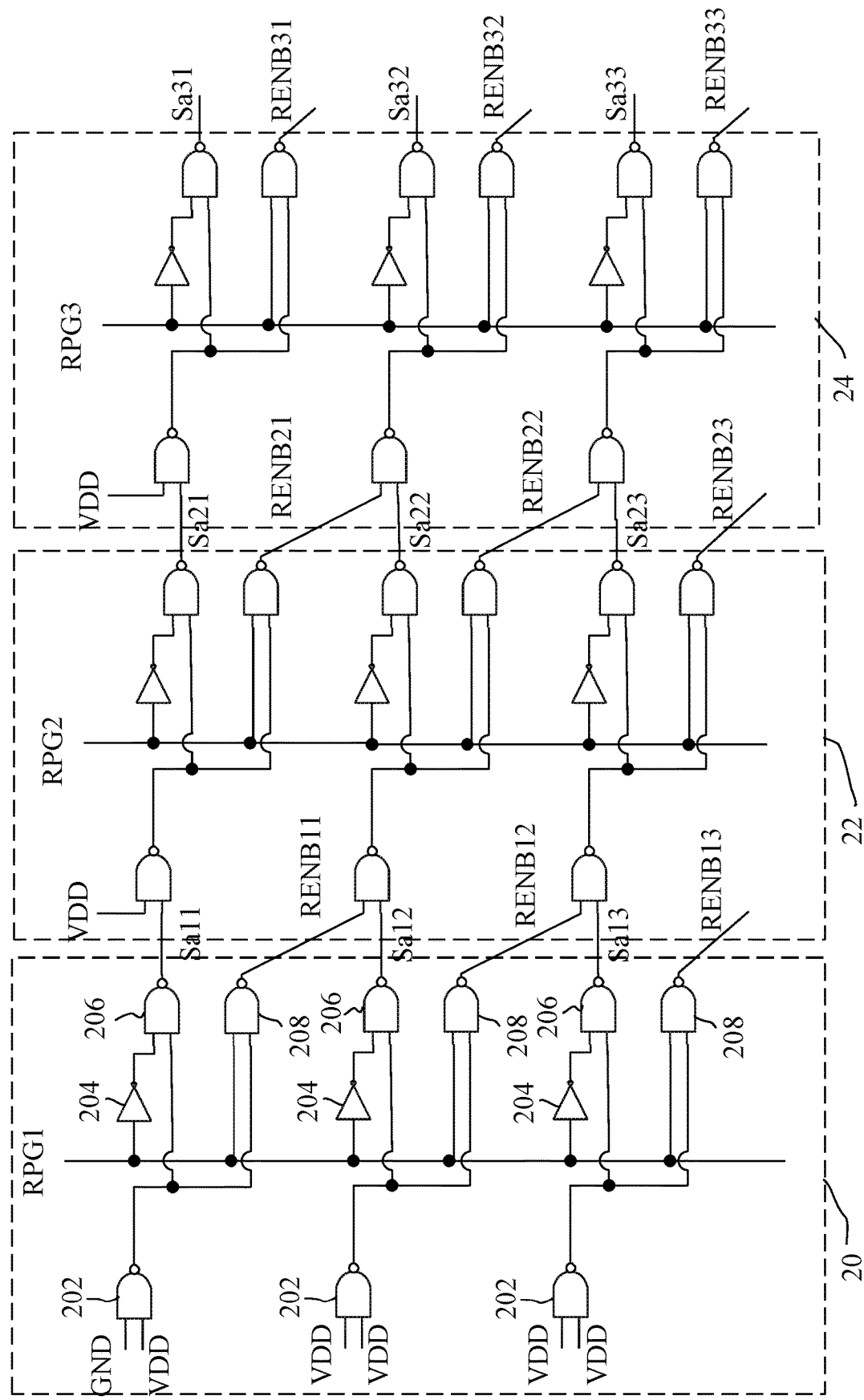
FIG. 3 shows an embodiment of the decoder in FIG. 2.

FIG. 3 shows an embodiment of the decoder in FIG. 2. Each of the decoders 20, 22, 24 and 26 includes a plurality of logic circuits. For example, in the decoder 20, NAND gates 202, 206 and 208 and an inverter 204 form a basic circuit, and the decoder 20 includes more than n pieces of cascaded basic circuits, wherein n is the number of the redundancy bits. In the decoder 20, the NAND gates 208 of all the basic circuits respectively output signals RENB11, RENB12 and RENB13, which jointly form the selection signal Se1 in FIG. 2. The NAND gates 206 of all the basic circuits respectively output signals Sa11, Sa12 and Sa13. The signals RENB11, RENB12, RENB13, Sa11, Sa12 and Sa13 jointly form the accumulation signal So1 of the decoder 20 in FIG. 2. In the embodiment, the response data is GND="0". Therefore, the position of "0" in the selection signal Se1 represents the redundancy bit to be selected. For example, if the selection signal is "101", the 2nd good redundancy bit R3 is selected and coupled to the input/output terminal I/O. If the selection signal is "110", the 3rd good redundancy bit R4 is selected and coupled to the input/output terminal I/O. In the embodiment, if the Mth general bit is a defective bit, the Mth selection signal SeM is determined according to the 1st repair data RPG1 to the Mth repair data RPGM, and one of the plurality of redundancy bits is selected to replace the Mth general bit, wherein M is an integer greater than zero.

FIG. 3 shows only a portion of the decoders 20, 22 and 24. The persons skilled in the art should be able to attain the complete circuits according to the contents disclosed in FIG. 3. In the embodiment shown in FIG. 3, each of the decoders 20, 22 and 24 are implemented with a plurality of NAND gates 202, 206 and 208. However, the present invention does not restrict that the decoders 20, 22 and 24 must be implemented with NAND gates. The decoder 20, 22 and 24 may also be implemented with a plurality of NOR gates or other logic gates. For example, if the preset response data is "1(VDD)", NOR gates may take the place of the NAND gates 202, 206 and 208.

In the memory repair circuit 12 in FIG. 1, each of the repair data RPG1-RPGm needs one decoder 20, 22 or 24 to perform decoding and determine the general bit needing replacing and the redundancy bit replacing the general bit, as shown in FIG. 2. Therefore, the repair circuit shown in FIG. 1 occupies a larger area. Besides, each decoder 20 provides the output thereof to the next decoder 22, whereby to count the redundancy bits that have been used. Thus, a delay time exists between the time point that the last decoder completes the operation thereof and the time point that the 1st decoder completes the operation thereof. The more the decoders, the longer the delay time, and the slower the processing speed of the repair circuit 12.

Figure 4:
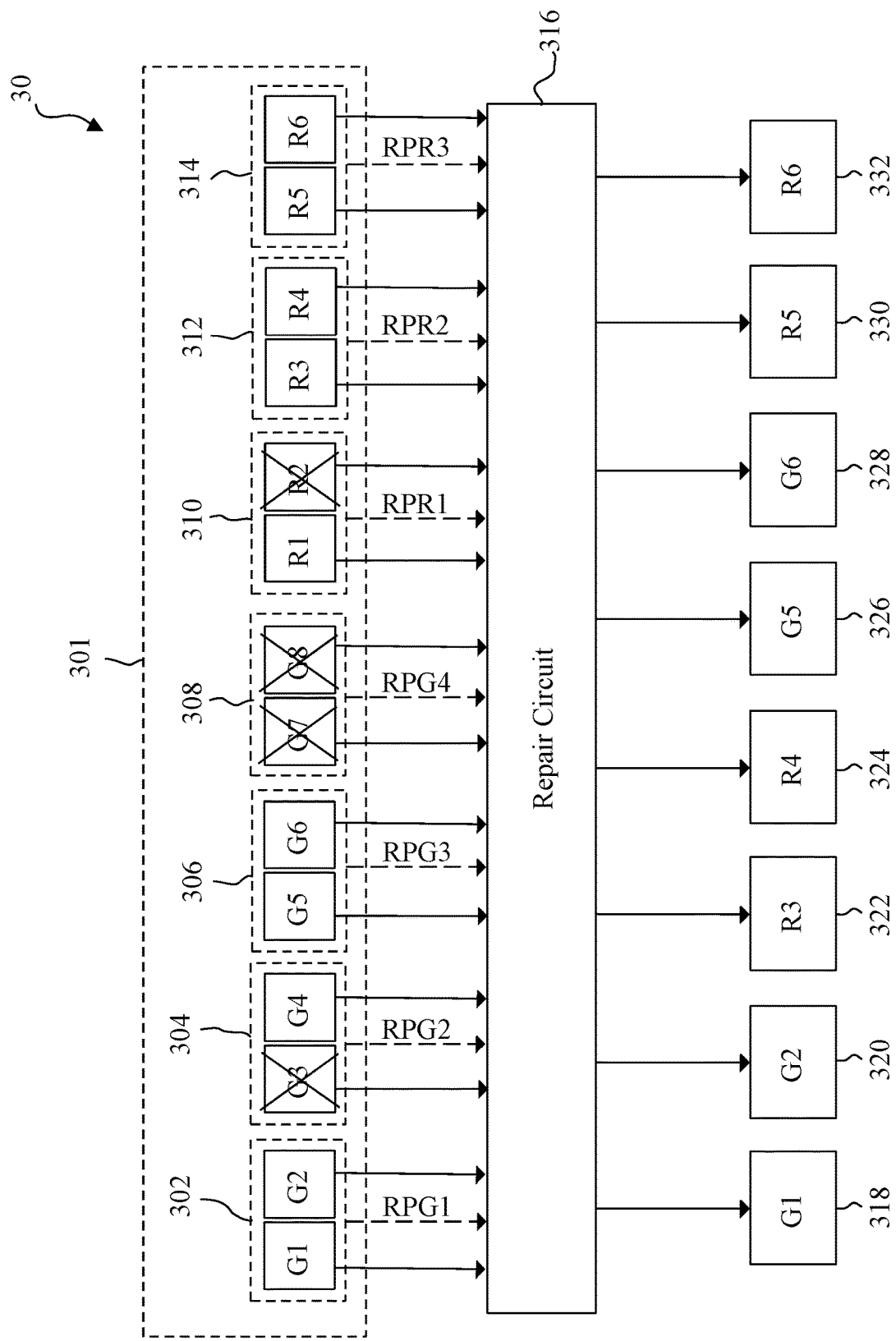
FIG. 4 shows a first embodiment of a memory repair method of the present invention, which uses a bit group as a repair unit.

FIG. 4 shows a first embodiment of a repair method of the present invention, which uses a bit group as a repair unit. In FIG. 4, a memory 30 comprises a register 301, a repair circuit 316, and a plurality of input/output terminals 318, 320, 322, 324, 326, 328, 330 and 332. The register 301 is connected to a plurality of general bits G1-G8 and redundancy bits R1-R6, which are selected from a memory array (not shown in the drawing). In FIG. 4, the memory bits G1-G8 and R1-R6 are arranged inside the register 301. However, it is only to express that these memory bits are connected to the register 301. In fact, the general bits G1-G8 and redundancy bits R1-R6 are not really disposed inside the register 301. The memory bits G1-G8 and R1-R6 are simultaneously selected in the same internal accessing activity. The plurality of general bits G1-G8 and redundancy bits R1-R6 may be on the same row of a memory array. In the embodiment shown in FIG. 4, two bits form a group. Therefore, the eight general bits G1-G8, which are connected to the register 301, are divided into four first groups 302, 304, 306 and 308; the six redundancy bits R1-R6, which are connected to the register 301, are divided into three second groups 310, 312 and 314. Next, inspections are performed to detect whether defective bits exist in the first groups 302, 304, 306 and 308 and the second groups 310, 312 and 314, whereby to generate the repair data RPG1-RPG4 and RPR1-RPR3 of the groups, wherein the repair data RPG1-RPG4 respectively indicate whether the first groups 302, 304, 306 and 308 have defective bits, and the repair data RPR1-RPR3 respectively indicate whether the second groups 310, 312 and 314 have defective bits. In the embodiment, the register 301 provides the repair data RPG1-RPG4 and RPR1-RPR3 to the repair circuit 316. However, the present invention does not restrict that the repair data RPG1-RPG4 and RPR1-RPR3 must be provided by the register 301. According to the repair data RPR1-RPR3, the repair circuit 316 excludes the second group 310 that has a defective bit from the second groups 310, 312 and 314 so as to prevent the second group 310 from being used to replace a first group having a defective bit. For example, the circuit 12 in FIG. 2 may be used to exclude the second group 310. According to the repair data RPG1-RPG4, the repair circuit 316 determines whether the first groups 302, 304, 306 and 308 have defective bits. If the first group A 302, 304, 306 or 308 has a defective bit, the repair circuit 316 selects one of the remaining second groups 312 and 314 to replace the first group having a defective bit. For example, the decoder and selection circuit in FIG. 2 may be used to select the second group. In the embodiment shown in FIG. 4, the repair circuit 316 determines that the first group 302 does not have a defective bit according to the repair data RPG1. Thus, the repair circuit 316 respectively connects the general bits G1 and G2 of the first group 302 to the input/output terminals 318 and 320. The repair circuit 316 determines that the first group 304 has a defective bit according to the repair data RPG2. Thus, the repair circuit 316 selects the second group 312 to replace the first group 304 and respectively connects the redundancy bits R3 and R4 of the second group 312 to the input/output terminals 322 and 324. The repair circuit 316 determines that the first group 306 does not have a defective bit according to the repair data RPG3. Thus, the repair circuit 316 respectively connects the general bits G5 and G6 of the first group 306 to the input/output terminals 326 and 328. The repair circuit 316 determines that the first group 308 has a defective bit according to the repair data RPG4. Thus, the repair circuit 316 selects the second group 314 to replace the first group 308 and respectively connects the redundancy bits R5 and R6 of the second group 314 to the input/output terminals 330 and 332. Please refer to FIG. 2 for the architecture of the repair circuit 316.

In the embodiment shown in FIG. 4, the repair data RPG1-RPG4 and RPR1-RPR3 of the groups are respectively determined according to the repair data of all the bits in the corresponding group. For example, in the first group 302, the repair data of the bit G1 and the bit G2 are "0"; it indicates that all the bits in the first group 302 are good memory bits. Therefore, the repair data. RPG1 of the first group 302 is set to be "0". In the first group 304, the repair data of the bit G3 and the bit G4 are respectively "1" and "0"; it indicates that the first group 304 has a defective bit. Therefore, the repair data RPG2 of the first group 304 is set to be "1". The repair data RPG1-RPG4 and RPR1-RPR3 of the groups may be preset. Alternatively, the repair data RPG1-RPG4 and RPR1-RPR3 of the groups may be obtained via performing operations of the repair data of the bits G1-G8 and R1-R6. For example, a NOR gate is used to process the repair data of the bits G1 and G2 to generate the repair data RPG1 of the group. In other embodiments, the repair data of a group having a defective bit is labeled by "0", and the repair data of a group without defective bits is labeled by "1".

In the embodiment shown in FIG. 4, the register 301 is configured to access the general bits G1-G8 and the redundancy bits R1-R6. In another embodiment, the register 301 is omitted, and the memory bits G1-G8 and R1-R6 selected by an internal accessing activity are directly coupled to the repair circuit 316.

The method shown in FIG. 1 uses a bit as a repair unit. If the number of general bits is 8, the repair circuit 12 needs eight decoders 20, 22 or 24 to respectively process the repair data of the general bits G1-G8. The method shown in FIG. 4 uses a bit group as a repair unit, wherein the repair circuit 316 needs only four decoders 20, 22 or 24 to process the repair data RPG1-RPG4 of four first groups 302, 304, 306 and 308. Therefore, the repair circuit 316 uses only a half of the decoders the method in FIG. 1 uses. Therefore, the repair circuit 316 has a simpler architecture and occupies a smaller area. Further, the delay time resulting from data transmission between decoders decreases, and the processing speed of the repair circuit 316 increases. In the embodiment shown in FIG. 4, two bits form a group. However, the present invention is not limited by the embodiment. The present invention may use groups each containing more than two bits. In some embodiment, each group contains t bits, and t is an integer greater than or equal to 2.

Figure 5:
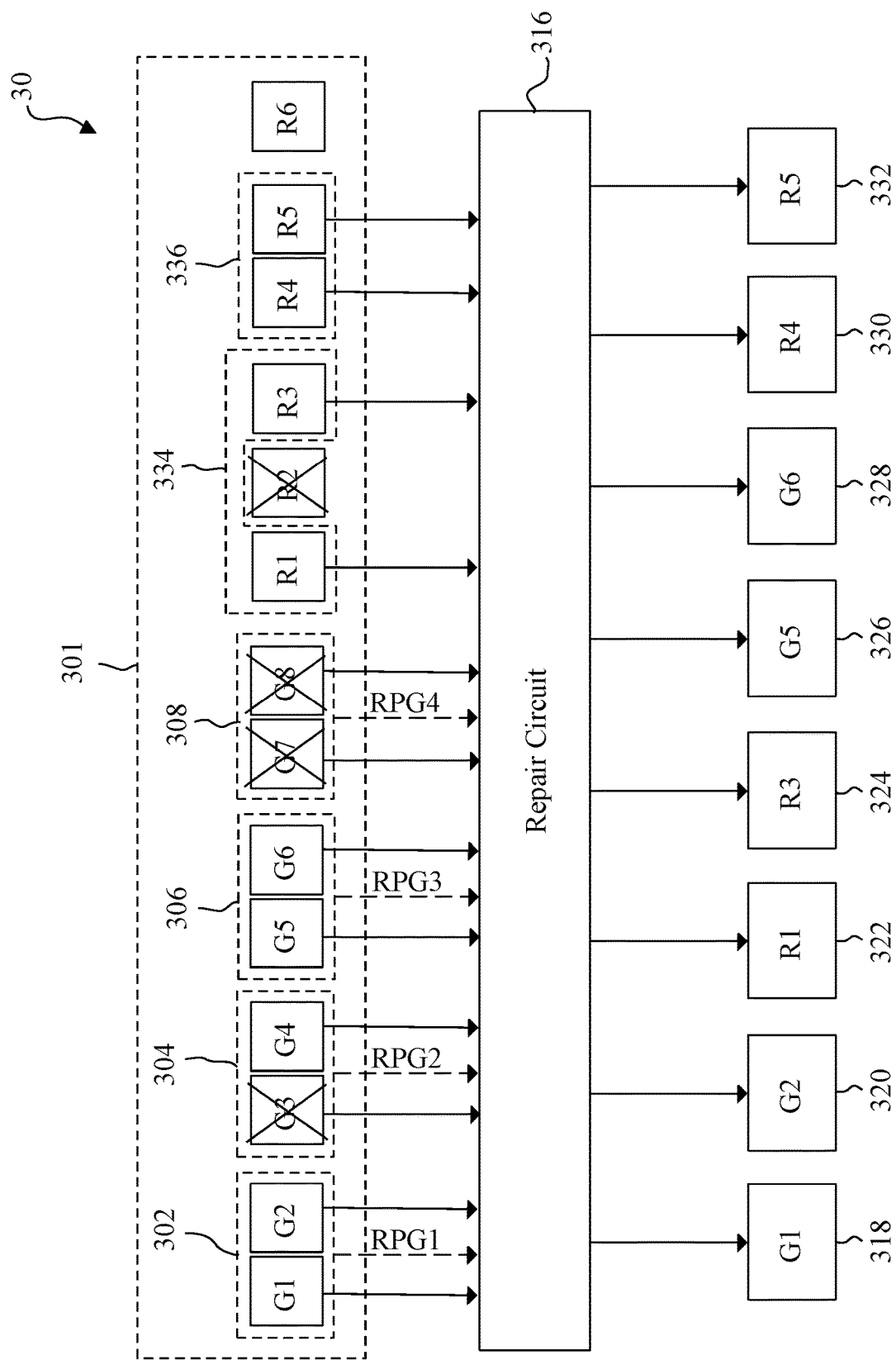
FIG. 5 shows a second embodiment of a memory repair method of the present invention, which uses a bit group as a repair unit.

FIG. 5 shows a second embodiment of a repair method of the present invention, which uses a bit group as a repair unit. In FIG. 5, the memory 30 also comprises a register 301, which is connected to general bits G1-G8 and redundancy bits R1-R6; a repair circuit 316; and a plurality of input/output terminals 318, 320, 322, 324, 326, 328, 330 and 332. The general bits G1-G8 are divided into a plurality of first groups 302, 304, 306 and 308. The method in FIG. 5 is different from the method in FIG. 4 in the following steps: detecting the redundancy bits R1-R6 first; excluding the defective bit R2; dividing the good redundancy bits R1 and R3-R6 into a plurality of second groups 334 and 336. According to the repair data RPG1-RPG4, the repair circuit 316 determines whether the first groups 302, 304, 306 and 308 have a defective bit. If the first group 302, 304, 306 or 308 has a defective bit, the repair circuit 316 selects one of the second groups 334 and 336 to replace the first group having a defective bit. As shown in FIG. 5, according to the repair data. RPG1, the repair circuit 316 determines that the first group 302 does not have a defective bit and thus respectively couples the general bits G1 and G2 of the first group 302 to the input/output terminals 318 and 320. According to the repair data RPG2, the repair circuit 316 determines that the first group 304 has a defective bit. Then, the repair circuit 316 selects the second group 334 to replace the first group 304 and couples the redundancy bits R1 and R3 of the second group 334 to the input/output terminals 322 and 324. According to the repair data RPG3, the repair circuit 316 determines that the first group 306 does not have a defective bit and thus respectively couples the general bits G5 and G6 of the first group 306 to the input/output terminals 326 and 328. According to the repair data RPG4, the repair circuit 316 determines that the first group 308 has a defective bit. Then, the repair circuit 316 selects the second group 336 to replace the first group 308 and couples the redundancy bits R5 and R6 of the second group 336 to the input/output terminals 330 and 332.

Figure 6:
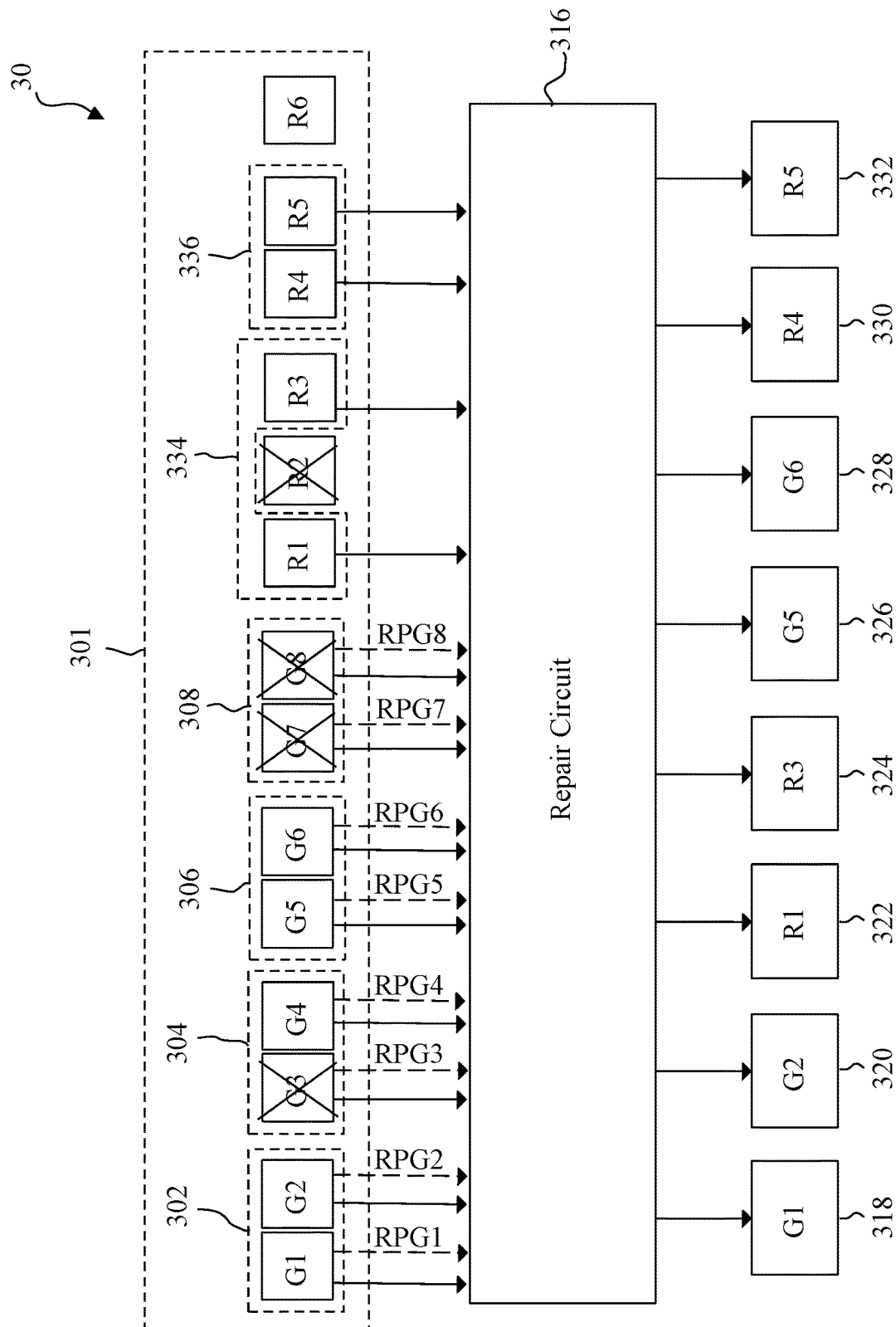
FIG. 6 shows a third embodiment of a memory repair method of the present invention, which uses a bit group as a repair unit.

FIG. 6 shows a third embodiment of a repair method of the present invention, which uses a bit group as a repair unit. Similar to the memory 30 in FIG. 5, the memory 30 in FIG. 6 also comprises a register 301, which is connected to general bits G1-G8 and redundancy bits R1-R6; a repair circuit 316; and a plurality of input/output terminals 318, 320, 322, 324, 326, 328, 330 and 332. The general bits G1-G8 are divided into four first groups 302, 304, 306 and 308. The redundancy bits R1-R6 are divided into two second groups 334 and 336. The memory 30 in FIG. 6 detects the plurality of general bits G1-G8 to determine whether the general bits G1-G8 have defective bits and generate corresponding repair data RPG1-RPG8. If the general bits of a first group are all good memory bits, the repair data of the first group is labeled by "00". If a first group has at least one defective bit, the repair data of the first group is labeled by "01", "10", or "11". The register 301 may provide the repair data RPG1-RPG8 to the repair circuit 316. However, the present invention does not restrict that the repair data RPG1-RPG8 must be provided by the register 301. In the embodiment shown in FIG. 6, the general bits G3, G7 and G8 are defective bits. Therefore, it may be inferred that the first group 304 having the general bit G3 is the first one of the groups having defective bits and the first group 308 having the general bits G7 and G8 is the second one of the groups having defective bits. Therefore, the repair data RPG3 and RPG4 of the first group 304 are set to be "01". According to the repair data "01" corresponding to the first group 304, the repair circuit 316 selects the 1st second group 334 (the first one of the second groups) to replace the first group 304. Similarly, the repair data RPG7 and RPG8 of the first group 308 are set to be "10". According to the repair data "10" corresponding to the first group 308, the repair circuit 316 selects the 2nd second group 336 (the second one of the second groups) to replace the first group 308. If the memory 30 has a 3rd first group having a defective bit and a 3rd second group, the repair data corresponding to the 3rd first group having a defective bit are set to be "11". According to the repair data "11" of the 3rd first group having a defective bit, the repair circuit selects the 3rd second group to replace the 3rd first group having a defective bit. On the other hand, the general bits of the first groups 302 and 306 are all good memory bits. Therefore, the repair data RPG1 and RPG2 and the repair data RPG5 and RPG6 are all set to be "00". In the embodiment, as two bits form a group, only three types of repair data "01" "10" and "11" are set corresponding to three second groups. If three bits form a group, seven types of repair data "001"-"111" may be set corresponding to seven second groups. The more bits a group has, the more second groups can be set. In the embodiment, the data "00" is configured to indicate that the bits in a group are all good memory bits. In other embodiments, the data "11" may be configured to indicate that the bits in a group are all good memory bits.

Figure 7:
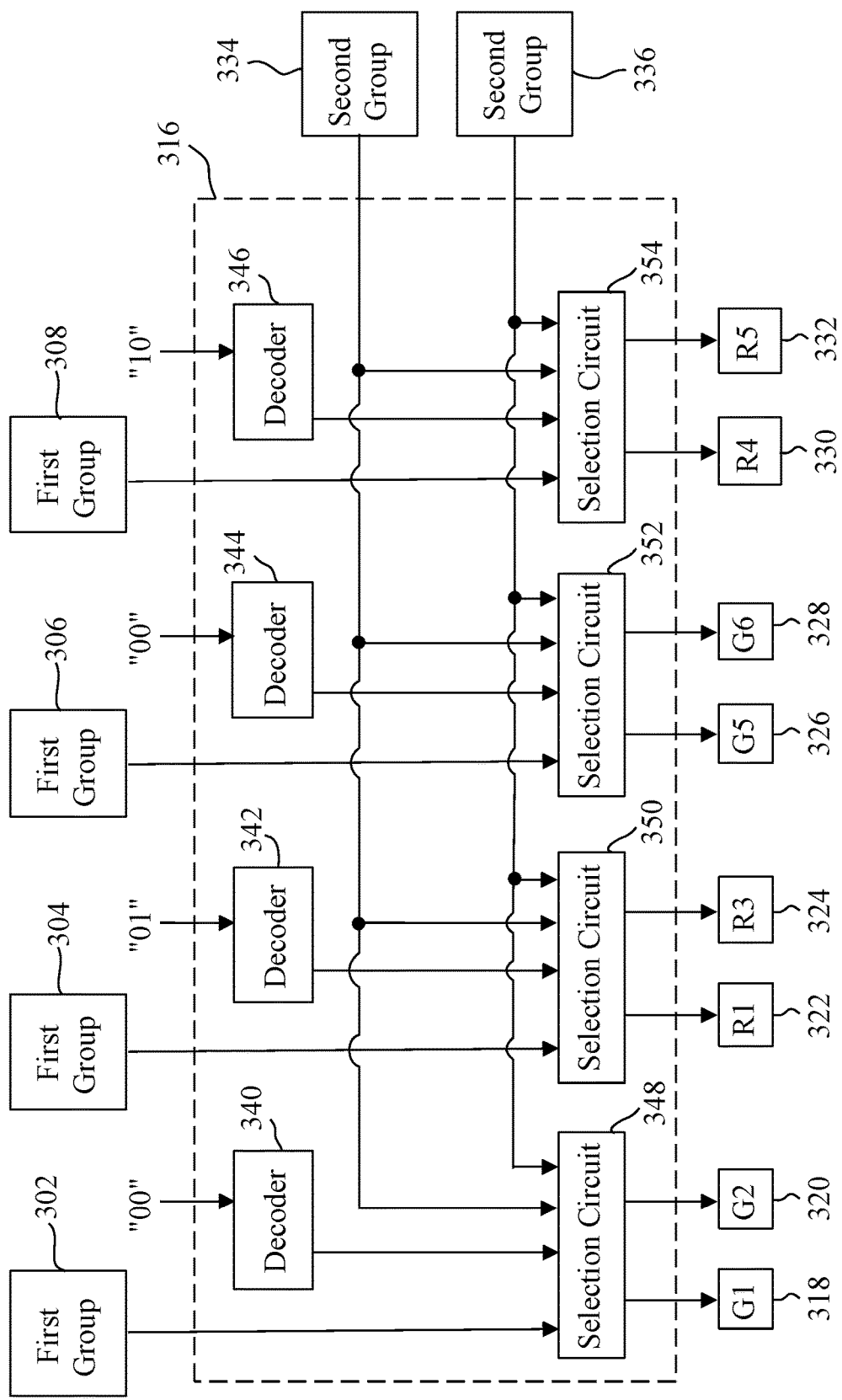
FIG. 7 shows an embodiment of the repair circuit in FIG. 6.
Figure 8:
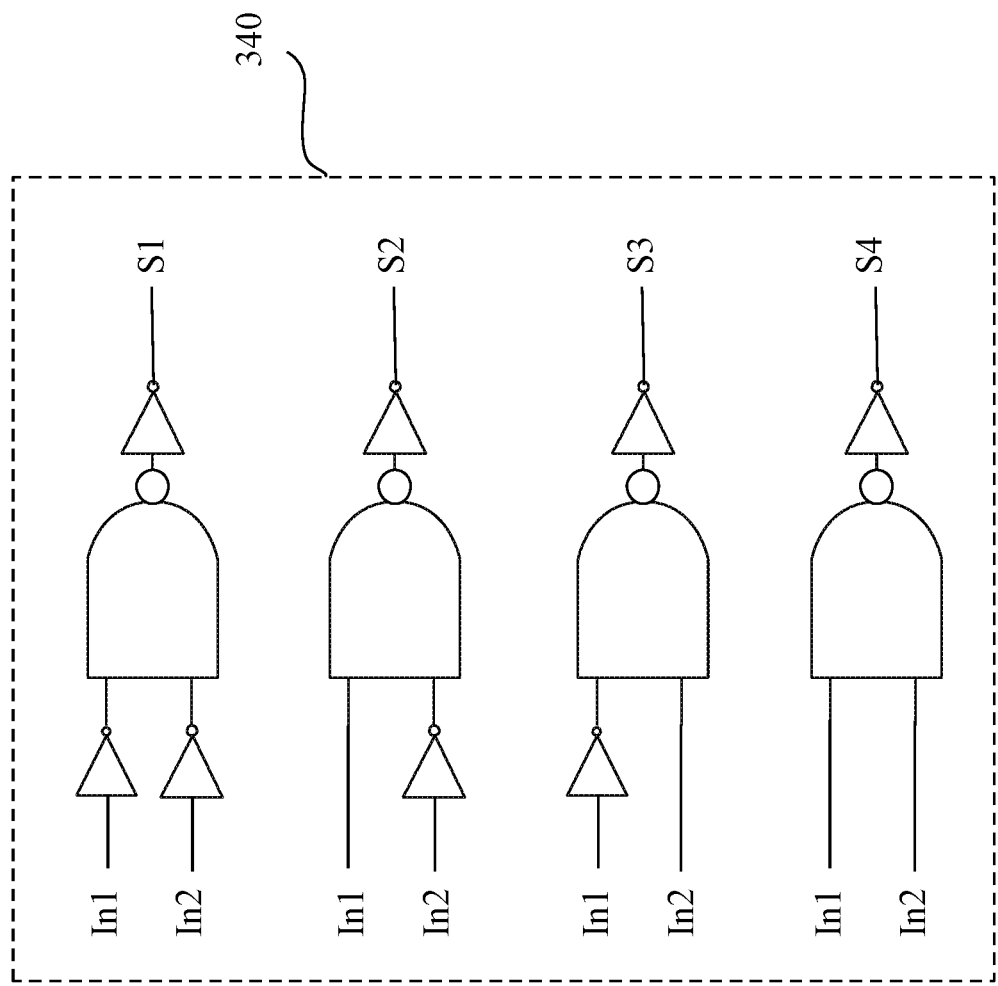
FIG. 8 shows an embodiment of the decoder in FIG. 7.

FIG. 7 shows an embodiment of the repair circuit 316 in FIG. 6. The repair circuit 316 in FIG. 7 comprises decoders 340, 342, 344 and 346; and selection circuits 348, 350, 352 and 354. The selection circuits 348, 350, 352 and 354 may be implemented with multiplexers. FIG. 8 shows an embodiment of the decoder 340 in FIG. 7. The circuits of the decoders 342, 344 and 346 are the same as the circuit of the decoder 340. Refer to FIG. 7 and FIG. 8. The decoder 340 receives the repair data "00" corresponding to the first group 302. In FIG. 8, the input terminal In1 receives the 1st data "0" in the repair data "00", and the input terminal In2 receives the 2nd data "0" in the repair data "00". Thus, the decoder 340 generates a selection signal "1000" according to the repair data "00". According to the selection signal "1000" provided by the decoder 340, the selection circuit 348 connects the first group 302 to the input/output terminals 318 and 320. The decoder 342 receives the repair data "01" corresponding to the first group 304 and generates a selection signal "0100" to make the selection circuit 350 select the 1st second group 334 and connect the second group 334 to the input/output terminals 322 and 324. The decoder 344 receives the repair data "00" corresponding to the first group 306 and generates a selection signal "1000" to make the selection circuit 352 connect the 3rd first group 306 to the input/output terminals 326 and 328. The decoder 346 receives the repair data "10" corresponding to the first group 308 and generates a selection signal "0010" to make the selection circuit 354 select the 2nd second group 336 and connect the 2nd second group 336 to the input/output terminals 330 and 332.

Compared with the decoder 20 in FIG. 2, the decoder 340 of the present invention (shown in FIG. 8) uses a simpler circuit and occupies a smaller area. Further, no data is transmitted among the decoders 340, 342, 344 and 346 of the present invention, as shown in FIG. 7. Therefore, increasing decoders will not decrease the processing speed of the repair circuit 316.

The embodiments have been described above to demonstrate the principles of the present invention and enable the persons skilled in the art to understand, make, and use the present invention. However, these embodiments are only to exemplify the present invention but not to limit the scope of the present invention. The technical thought and scope of the present invention is defined by the claims stated below and the equivalents thereof. Any modification or variation according to the principle, spirit or embodiment of the present invention is to be also included by the scope of the present invention.

What is claimed is:

1. A repair method of a memory, wherein said memory includes a plurality of general bits and a plurality of redundancy bits, comprising the steps of:

(A) dividing said plurality of general bits into a plurality of first groups, wherein each of said plurality of first groups has t general bits, and wherein t is an integer greater than or equal to 2;

(B) dividing said plurality of redundancy bits into a plurality of second groups, wherein each of said plurality of second groups has t redundancy bits;

(C) detecting said plurality of first groups to generate a plurality of first repair data, wherein said plurality of first repair data respectively indicate whether said plurality of first groups have defective bits by determining whether each of the plurality of first repair data include given values, wherein when a corresponding first repair data of the plurality of first repair data does not include the given values, the corresponding first repair data is assigned to correspond to one of the plurality of second groups; and (D) using one of said plurality of second groups corresponding to the corresponding first repair data to replace a first group having a defective bit;

wherein said plurality of general bits and said plurality of redundancy bits are simultaneously selected in an internal accessing activity.

2. The repair method according to claim 1, wherein said plurality of general bits and said plurality of redundancy bits are on an identical row.

3. The repair method according to claim 1, further comprising connecting said plurality of general bit and said plurality of redundancy bits to a register before executing said step (A) and said step (B).

4. The repair method according to claim 1, further comprising steps:
detecting said plurality of second groups to generate a plurality of second repair data, wherein said plurality of second repair data respectively indicate whether said plurality of second groups have defective bits; and
excluding a second groups having a defective bit according to said plurality of second repair data to prevent said second group having a defective bit from being used to replace said first groups having a defective bit.

5. The repair method according to claim 1, wherein said step (B) comprises dividing good redundancy bits in said plurality of redundancy bits into said plurality of second groups.

6. The repair method according to claim 1, wherein said step (D) includes while an Mth first group of said plurality of first groups has a defective bit, selecting one of said plurality of second groups to replace said Mth first group according to first repair data corresponding to from a 1st first group of said plurality of first groups to said Mth first group, wherein M is an integer greater than zero.

7. The repair method according to claim 1, wherein said step (D) includes while an Mth first group of said plurality of first groups has a defective bit, selecting one of said plurality of second groups to replace said Mth first group according to an Mth first repair data of said plurality of first repair data, which is corresponding to said Mth first group, wherein M is an integer greater than zero.

8. The repair method according to claim 7, wherein said Mth first repair data includes information of a second group to be selected.

9. The repair method according to claim 7, further comprising decoding said Mth first repair data to generate a selection signal to select one of said plurality of second groups for replacing said Mth first group.

10. A repair method of a memory, wherein said memory includes a plurality of general bits and a plurality of redundancy bits, comprising the steps of:

(A) dividing said plurality of general bits, which are connected to a register, into a plurality of first groups, wherein each of said first groups has t general bits, and wherein t is an integer greater than or equal to 2;

(B) dividing said plurality of redundancy bits, which are connected to said register, into a plurality of second groups, wherein each of said plurality of second groups has t redundancy bits;

(C) detecting said plurality of first groups to generate a plurality of first repair data, wherein said plurality of first repair data respectively indicate whether said plurality of first groups have defective bits by determining whether each of the plurality of first repair data include given values, wherein when a corresponding first repair data of the plurality of first repair data does not include the given values, the corresponding first repair data is assigned to correspond to one of the plurality of second groups; and (D) using one of said plurality of second groups corresponding to the corresponding first repair data to replace a first group having a defective bit.

11. The repair method according to claim 10, wherein said plurality of general bits and said plurality of redundancy bits are on an identical row.

12. The repair method according to claim 10, further comprising:
detecting said plurality of second groups to generate a plurality of second repair data, wherein said plurality of second repair data respectively indicate whether said plurality of second groups have defective bits; and
excluding a second group having a defective bit according to said plurality of second repair data to prevent said second group having a defective bit from being used to replace said first group having a defective bit.

13. The repair method according to claim 10, wherein said step (B) further comprises dividing good redundancy bits in said plurality of redundancy bits into said plurality of second groups.

14. The repair method according to claim 10, wherein said step (D) includes while an Mth first group of said plurality of first groups has a defective bit, selecting one of said plurality of second groups B to replace said Mth first group according to first repair data corresponding to from a 1st first group of said plurality of first groups to said Mth first group, wherein M is an integer greater than zero.

15. The repair method according to claim 10, wherein said step (D) includes while an Mth first group of said plurality of first groups has a defective bit, selecting one of said plurality of second groups to replace said Mth first group according to an Mth first repair data of said plurality of first repair data, which is corresponding to said Mth first group, wherein M is an integer greater than zero.

16. The repair method according to claim 15, wherein said Mth first repair data includes information of a second group to be selected.

17. The repair method according to claim 15, further comprising decoding said Mth first repair data to generate a selection signal to select one of said plurality of second groups for replacing said Mth first group.

18. A repair circuit of a memory, wherein said memory includes a plurality of general bits and a plurality of redundancy bits, comprising:
a decoder, configured to decode a repair data corresponding to an Mth first group of a plurality of first groups to generate a selection signal, wherein each of said plurality of first groups has t general bits, and wherein M is an integer greater than zero, and wherein t is an integer greater than 2, wherein the repair data are generated by detecting the Mth first group, and the repair data indicate whether the Mth first group has a defective bit by determining whether the repair data include given values, wherein when the repair data do not include the given values, the repair data is assigned to correspond to one of the plurality of second groups; and a selection circuit, configured to connect said decoder and a plurality of input/output terminals of said memory, configured to select one group from said Mth first group and a plurality of second groups according to said selection signal, and configured to connect said one group to said plurality of input/output terminals, wherein each of said plurality of second groups has t redundancy bits, wherein said plurality of general bits and said plurality of redundancy bits are simultaneously selected in an internal accessing activity.

19. The repair circuit according to claim 18, wherein said plurality of general bits and said plurality of redundancy bits are on an identical row.

20. The repair circuit according to claim 18, further comprising a register connected to said decoder and configured to connect with said plurality of general bits and said plurality of redundancy bits.

21. The repair circuit according to claim 18, wherein said decoder includes a plurality of logic gates.

22. The repair circuit according to claim 18, wherein said selection circuit includes a multiplexer.

23. The repair circuit according to claim 18, wherein said repair data is provided by said Mth first group.

24. A repair circuit of a memory, wherein said memory includes a plurality of general bits and a plurality of redundancy bits, comprising:

a register, configured to connect with said plurality of general bits and said plurality of redundancy bits;

a decoder, connected with said register, configured to decode a repair data corresponding to an Mth first group of a plurality of first groups to generate a selection signal, wherein each of said plurality of first groups has t general bits, and wherein M is an integer greater than zero, and wherein t is an integer greater than 2, wherein the repair data are generated by detecting the Mth first group, and the repair data indicate whether the Mth first group has a defective bit by determining whether the repair data include given values, wherein when the repair data do not include the given values, the repair data is assigned to correspond to one of the plurality of second groups; and a selection circuit, configured to connect with said decoder and a plurality of input/output terminals of said memory, configured to select one group from said Mth first group and a plurality of second groups according to said selection signal, and configured to connect said one group to said plurality of input/output terminals, wherein each of said plurality of second groups has t redundancy bits.

25. The repair circuit according to claim 24, wherein said plurality of general bits and said plurality of redundancy bits are on an identical row.

26. The repair circuit according to claim 24, wherein said decoder includes a plurality of logic gates.

27. The repair circuit according to claim 24, wherein said selection circuit includes a multiplexer.

28. The repair circuit according to claim 24, wherein said repair data is provided by said Mth first group.

* * * * *